United States Patent
Lund et al.

[19]

[11] Patent Number: 5,804,979
[45] Date of Patent: Sep. 8, 1998

[54] CIRCUIT FOR MEASURING IN-CIRCUIT RESISTANCE AND CURRENT

[75] Inventors: John M. Lund, Marysville; Steven Dennis Swift, Seattle, both of Wash.

[73] Assignee: Fluke Corporation, Everett, Wash.

[21] Appl. No.: 855,276

[22] Filed: May 13, 1997

[51] Int. Cl.$^6$ .................................................. G01R 27/08
[52] U.S. Cl. ...................... 324/713; 324/715; 324/126
[58] Field of Search ................................ 324/601, 691, 324/713, 715, 123 R, 126

[56] References Cited

U.S. PATENT DOCUMENTS

| | | | |
|---|---|---|---|
| 3,863,148 | 1/1975 | Fellrath et al. | 324/715 |
| 4,175,253 | 11/1979 | Pitegoff | 324/715 |
| 4,584,525 | 4/1986 | Harnden, Jr. et al. | 324/126 |
| 5,386,188 | 1/1995 | Minneman et al. | 324/126 |

*Primary Examiner*—Diep N. Do

[57] ABSTRACT

A circuit for measuring alternating current (a.c.) and direct current (d.c.) in a conductor without breaking the conductor is provided. A modulated current source is coupled in parallel with a segment of the conductor to inject a test current. A synchronous demodulator is also coupled in parallel across the segment to separate the test voltage drop induced by the test current from the voltage drop due to the current in the conductor. The test voltage drop and the voltage drop are measured by a voltmeter and the resistance of the segment and the current flowing through the segment can then be calculated.

12 Claims, 3 Drawing Sheets

CIRCUIT FOR MEASURING IN-CIRCUIT RESISTANCE AND CURRENT

BACKGROUND OF THE INVENTION

This invention relates generally to circuits for measuring electrical current flow and in particular to a method and apparatus for measuring electrical current flow in a conductor of an operating circuit.

Measuring electrical current flow through a conductor may be done in a number of different ways. The traditional invasive approach is to break the conductor and insert a current measuring device such as an ammeter in series with the conductor. However, in many cases, breaking the conductor, which may be in the form of a copper wire, printed circuit (p.c.) board trace, or integrated circuit lead, is difficult and inconvenient, and may also cause damage to the conductor, particularly in the case of p.c. board traces.

Non-invasive approaches have been developed that allow for making in-circuit current measurements without breaking the conductor. Current clamps and magnetic pickup probes are used to detect the magnetic field surrounding the wire in order to determine the current passing through the wire. Such techniques allow the current to be determined without touching the conductor. However, current clamps and magnetic pickup probes generally suffer from the effects of interference from adjacent magnetic fields and require a substantial amount of physical clearance around the conductor, making their use in testing current in p.c. board traces limited.

Another non-invasive approach is the use of a pair of two-wire probes ("Kelvin clips") which make electrical contact with the conductor at two separate points along its length, commonly called a four-wire measurement, which eliminates the effect of resistance in the probes. Each two-wire probe has a source contact and a sense contact. The voltage drop between the two points is measured between the sense contacts. The measured voltage is nulled to zero using a balancing current injected through the source contacts. The balancing current, which is adjusted to equal the current through the conductor, may now readily be measured with an external ammeter without breaking the conductor. Current balancing techniques, however, provide only limited measurement accuracy and range. At the low end of the current range, the limitation is the ability of the instrument to sense the relatively small voltage drops in the millivolt range that are developed across a short section of conductor. At the high end of the current range, the limitation is ability of the measurement instrument to generate the balancing current.

Another non-invasive technique for measuring current is described in U.S. Pat. No. 5,386,188, "In-Circuit Current Measurement", issued Jan. 31, 1995, to Minneman et al., and assigned to Keithley Instruments, Inc. Minneman et al. teach injecting first and second currents through an element of the conductor using the four-wire measurement technique and measuring the first and second voltage drops across the element. The values of the first and second currents and the first and second voltage drops are then used to calculate the current through the conductor. However, the circuit provides only a limited ability to handle a.c. currents and noise present in the conductor current.

Therefore, it would be desirable to provide a circuit for non-invasively measuring current in a conductor with improved measurement range and without regard to the a.c. or d.c. content of the current.

SUMMARY OF THE INVENTION

In accordance with the present invention, a circuit for measuring alternating current (a.c.) and direct current (d.c.) in a conductor without breaking the conductor is provided. The circuit is coupled to several points on the conductor, usually in close physical proximity to define a segment of the conductor, via a pair of two-wire probes, each two-wire probe having a sense contact and a source contact that are both coupled to the conductor.

The circuit is first configured to measure resistance by coupling a modulated current source in parallel with the segment through the source contacts to inject a test current. At the same time, a synchronous demodulator is also coupled in parallel across the segment to separate the test voltage drop across the segment induced by the test current from the voltage drop due to the conductor current. The modulated current source and the synchronous demodulator are both coupled to a reference waveform generator to receive a modulation waveform to achieve synchronous detection of the test voltage drop developed by the test current of the modulated current source. Synchronous demodulation allows for the separation of low level signals from a relatively high amplitude interference signals. The frequency of the modulation waveform may be selected so that noise and interference due to the conductor current does not substantially interfere with or degrade the measurement of the test voltage drop signal and is below a predetermined noise floor level.

The test voltage drop separated by the synchronous detector is measured by a voltmeter configured to measure d.c. voltage. Because the test current $I_t$ is known and the voltage drop with the current source on, $V_{on}$, and the voltage drop with the current source off, $V_{off}$, can be measured, the resistance of the segment can thus be calculated according to the following equation.

$$R_{seg} = [V_{on} - V_{off}]/I_t$$

$V_{on}$ and $V_{off}$ are both measured at the output of the synchronous detector by the voltmeter as a d.c. voltage and is the test voltage drop $[V_{on} - V_{off}]$.

The circuit can be further configured to provide in-circuit current measurements. The voltmeter is coupled directly across the segment to measure voltage drop with the current source turned off. Because the conductor current may contain a.c. content, the voltmeter may be configured for a.c. volts rms (root mean squared) to obtain the correct voltage drop $V_0$. With $R_{seg}$ and $V_0$ now known, the current I flowing through the segment may be calculated according to the following equation.

$$I = V_{seg}/R_{seg}$$

In this way, the current flowing through a conductor may be obtained regardless of the a.c. content of the current.

One object of the present invention is to provide an apparatus for measuring in-circuit a.c. and d.c. current in a conductor.

Another object of the present invention is to provide an apparatus for measuring resistance in a conductor in which a.c. current is present.

An additional object of the present invention is to provide an apparatus for measuring in-circuit a.c. and d.c. current using synchronous demodulation of the test current.

A further object of the present invention is to provide a method of synchronously modulating and demodulating the test current in a conductor to reject the a.c. components of the conductor current.

Other features, attainments, and advantages will become apparent to those skilled in the art upon a reading of the following description when taken in conjunction with the accompanying drawings.

DETAILED DESCRIPTION OF THE INVENTION

Figure 1:
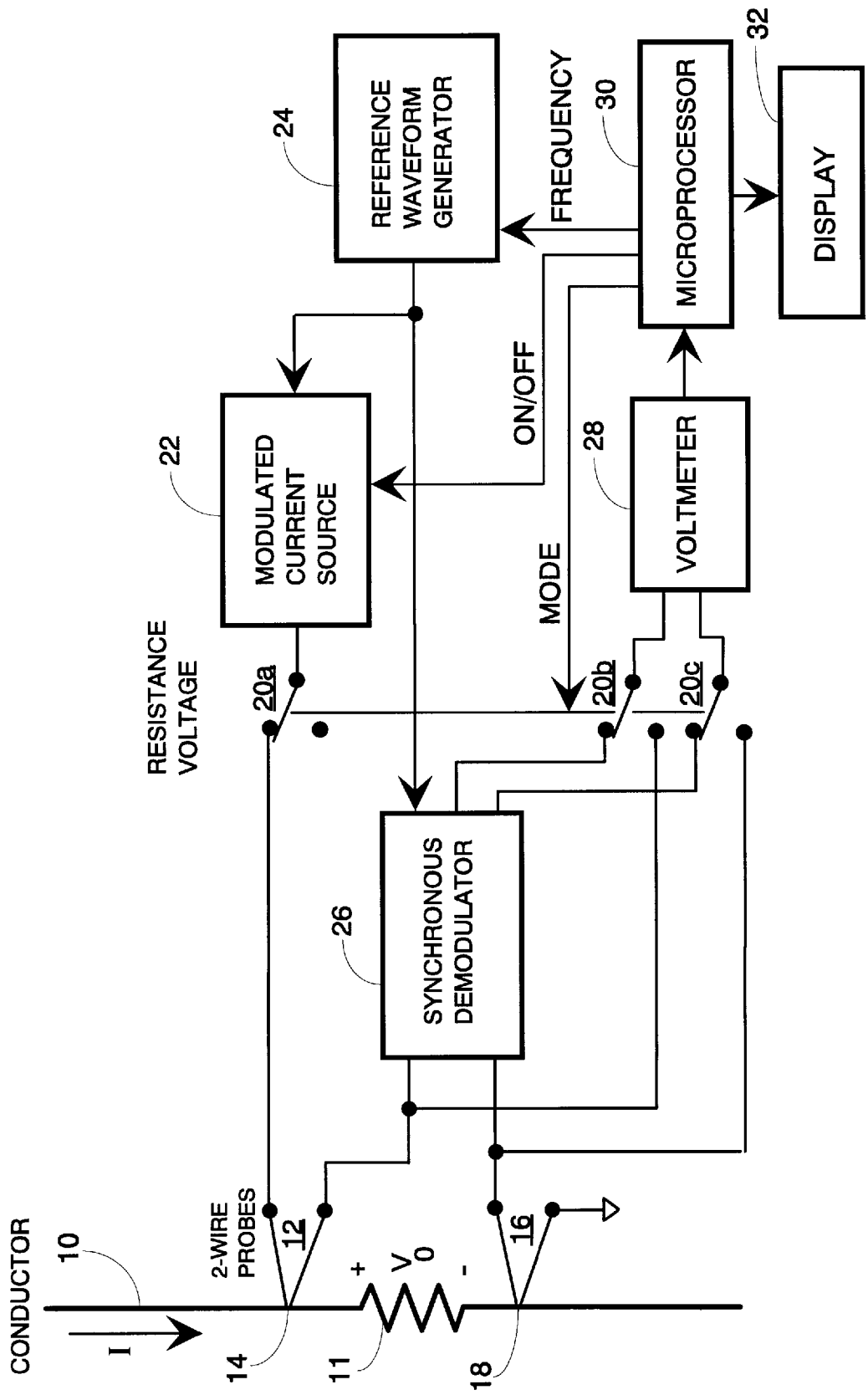
FIG. 1 is a block diagram of a circuit for measuring current and resistance in a conductor according to the present invention.

FIG. 1 is a block diagram of the circuit for measuring current and resistance according to the present invention. A conductor 10 may comprise a wire, a printed circuit board trace, an integrated circuit lead, or any other type of metal capable of conducting electrical current. A two-wire probe 12 is placed at point 14 along the length of the conductor, with adjacent source and sense leads making electrical contact with the conductor 10. A two-wire probe 16 is placed at point 18 with adjacent source and sense leads making electrical contact with the conductor 10. The length between the points 14 and 18 of the conductor comprises a segment which has a certain amount of resistance modeled by the resistor 11. The resistor 11 is typically not a discrete component but rather a model of the trace resistance which varies according to the length of the segment of the conductor 10. A voltage drop $V_0$ appears across the resistor 11 as a result of a current I flowing through the conductor 10.

A modulated current source 22 is coupled to the source lead of the 2-wire probe 12 via a switch 20a. The switch 20a, along with switches 20b and 20c comprise a ganged switch with upper and lower positions corresponding to a resistance measuring mode and a current measuring mode respectively. The switches 20a–c are shown in the upper position for resistance measuring mode. The modulated current source 22 produces a test current $I_t$ that has modulation components responsive to a modulation signal produced by a reference waveform generator 24.

The reference waveform generator 24 produces the modulation signal at a desired frequency in order to minimize the noise floor received from the conductor current. A set of modulation frequencies may be maintained and selected as needed to obtain a noise floor below a predetermined level, as explained in more detail in FIG. 2. In the preferred embodiment, the modulation signal is in the form of a square wave with a frequency of approximately 61 hertz.

A synchronous demodulator 26 is coupled across the conductor 10 at the points 14 and 18 via the sense leads of the two-wire probes 12 and 16 to receive a voltage drop signal at a pair of input terminals. The synchronous demodulator 26 also receives the modulation signal from the reference waveform generator 24 in order to synchronously demodulate the voltage drop signal, which may contain both the test voltage drop signal and voltage drop from the current I.

A voltmeter 28 is coupled to an output of the synchronous demodulator 26 to receive the test signal as $V_{on}$ and $V_{off}$ via the switches 20b and 20c in resistance measurement mode. $V_{on}$ is measured with the modulated current source 22 turned on and $V_{off}$ is measured with the modulated current source 22 turned off. The values of $V_{on}$ and $V_{off}$ are converted to digital measurement values in the voltmeter 28 and coupled to a microprocessor 30 which stores $V_{on}$ and $V_{off}$. The voltmeter 28 may comprise a self-contained digital voltmeter or alternatively may comprise an analog to digital converter with a sample clock and appropriate filtering circuitry to produce the digital measurement values.

The microprocessor 30 provides signals capable of controlling the mode of the circuit for the resistance measuring mode and the current measuring mode. The microprocessor 30 provides a MODE signal to the switches 20a–c which sets each of the switches 20a–c up for resistance measuring mode and down for current measuring mode. In resistance measuring mode, the modulated current source 22 and synchronous demodulator 26 are coupled in parallel across the segment. While in the resistance measuring mode, the modulated current source 22 is turned off to measure $V_{off}$ and on to measure $V_{on}$ according to an OFF/ON signal provided by the microprocessor 30. The microprocessor 30 may also be used to select the appropriate frequency of the test signal in response to a FREQUENCY signal provided to the reference waveform generator 24 while comparing the signal level of $V_{off}$ against a predetermined maximum noise floor level.

Since the value of the test current $I_t$ generated by the modulated current source 22 is known and the values of $V_{on}$ and $V_{off}$ have been stored, the microprocessor 30 may then calculate the value of the resistor 11 for the segment between points 14 and 18 as shown according the following formula.

$$R_{seg}=[V_{on}-V_{off}]/I_t$$

The segment resistance $R_{seg}$, may be assumed to be constant over a limited range of frequencies, typically less than 1 MegaHertz. The segment resistance $R_{seg}$ may then be sent to a display 32 for visual display.

The microprocessor 30 may then configure the circuit for current measurement mode by setting the switches 20a–c to the lower position. Now, the voltmeter 28 is connected across the segment to directly measure Vo. The modulated current source 22 and synchronous 26 are disconnected from the conductor 10. Because the current I may contain a.c. components, the voltmeter can be configured to measure a.c. volts in order to accurately measure the voltage drop $V_0$ across the segment. Because the voltage drop $V_0$, as well as $V_{on}$ and $V_{off}$, is a low level voltage signal, special techniques for measuring low level voltage, such as shielding and guarding techniques known in the art, may need to be employed.

Once the value for $V_0$ has been determined and provided by the voltmeter 28 to the microprocessor 30, the value of the current I may then be calculated according to the following equation.

$$I=V_{seg}/R_{seg}$$

The current I may then be sent to the display 32 for visual display.

Figure 2:
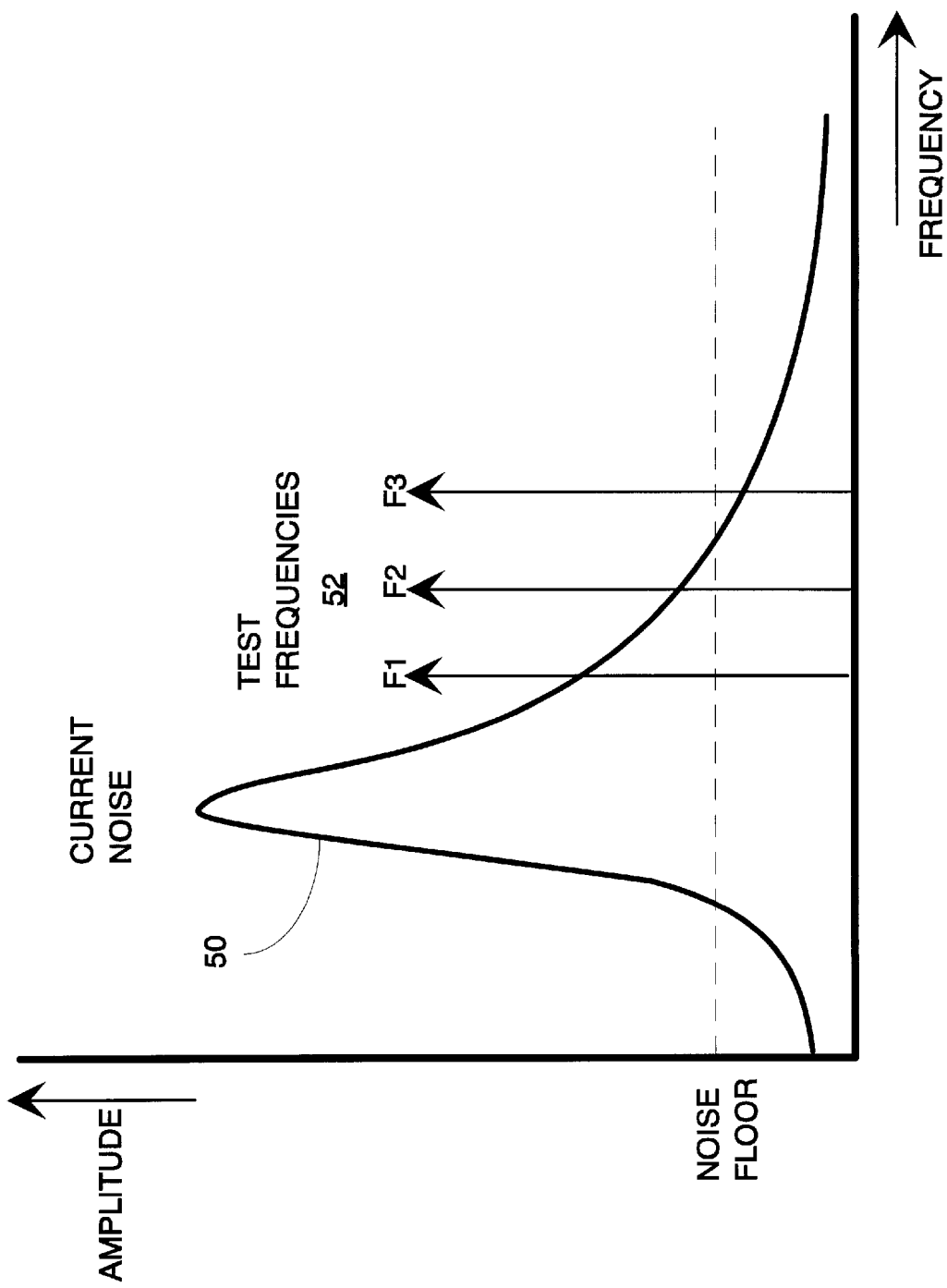
FIG. 2 is a graph of amplitude versus frequency showing the relationship of test frequencies to conductor frequency for the circuit of FIG. 1.

FIG. 2 is a graph of amplitude versus frequency illustrating the process of selecting an appropriate test frequency according to the present invention. The trace 50 labeled CURRENT NOISE shows the amplitude versus frequency content of the voltage drop Vo which contains a substantial amount of high frequency energy. Any of a variety of distributions of amplitude versus frequency may be possible, thus making the selection of multiple test frequencies desirable in order to obtain a resistance measurement at the desired accuracy level. A set of test frequencies 52, labeled F1, F2, and F3, may be selected in order to obtain a noise floor below the predetermined maximum level labeled NOISE FLOOR. The actual noise floor for a test frequency is determined by the amplitude of the trace 50 at that test frequency. In this case, only the frequency F3 provides an acceptable noise floor level below the predetermined maximum level NOISE FLOOR and would be employed to make the measurement.

Figure 3:
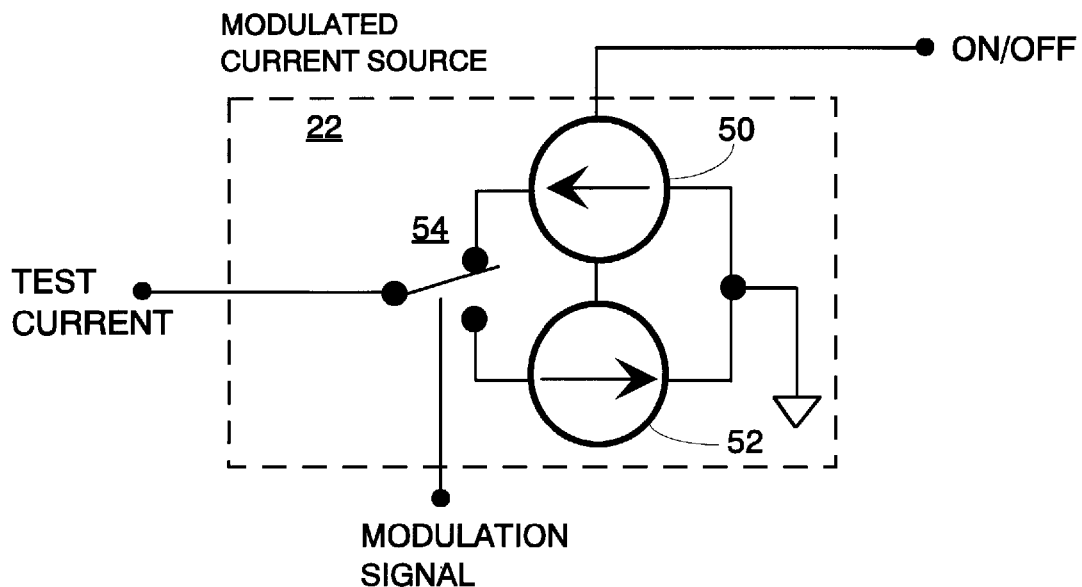
FIG. 3 is a schematic diagram of the preferred embodiment of the modulated current source of FIG. 1.

FIG. 3 is a schematic diagram of the modulated current source 22 according to the preferred embodiment of the present invention. Current sources 50 and 52 are both coupled to contacts of the switch 54 which alternatively couples the test current $I_t$ from each of the current sources 50 and 52 to the segment of the conductor 10 responsive to the modulation signal received from the reference waveform generator 24. In this way, the test current $I_t$ contains a.c. content at the desired test frequency. The modulation signal is preferably a square wave to ensure accurate actuation of the switch 54.

Figure 4:
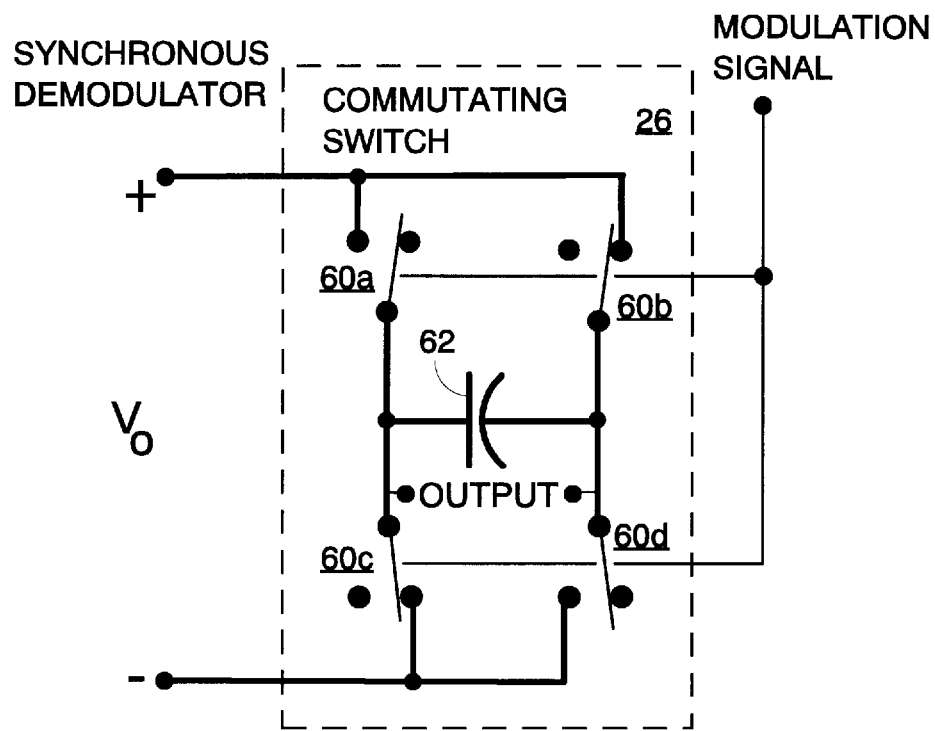
FIG. 4 is a schematic diagram of the preferred embodiment of the synchronous demodulator of FIG. 1.

FIG. 4 is a schematic diagram of the synchronous detector according to the preferred embodiment of the present invention. Switches 60a–d are coupled across the segment of the conductor 10 and each of the switches 60a–d actuate in a manner synchronized to the modulation signal from the reference waveform generator 24. A capacitor 62 operates as a sample and hold circuit to store the voltage value received from across the segment. The switches 60a–d collectively form a commutator switch in order to couple the capacitor 62 across the segment in opposing polarities in a manner synchronized to the modulated current source 22 shown in FIG. 3 so that a test voltage drop is developed across the capacitor 62. The voltage drop due to the current I, which may contain d.c. and a.c. components which are unsynchronized and out of band signals, is thus separated from the test voltage drop due to the test current $I_t$.

It will be obvious to those having ordinary skill in the art that many changes may be made in the details of the above described preferred embodiments of the invention without departing from the spirit of the invention in its broader aspects. For example, the modulation signal may take a variety of waveshapes such as sawtooth and sine waves. The test frequency need not be constant and the modulation waveform may consist of pseudo-random intervals or employ agile frequency hopping in the manner of spread spectrum communications technology in order to more effectively reject the current noise from the current I using synchronous demodulation and obtain a resistance measurement of the desired accuracy. The choice of modulation signal characteristics may be arrived at through a reasonable amount of experimentation. Therefore, the scope of the present invention should be determined by the following claims.

What we claim as our invention is:

1. A method for measuring current in a conductor comprising:
   (a) selecting a segment of said conductor, said current producing a voltage drop across said segment;
   (b) coupling a modulated current source across said segment, said modulation current source producing a test current responsive to a modulation waveform having a selected frequency to produce a test voltage drop across said segment;
   (c) coupling a synchronous demodulator across said segment to separate said test voltage drop from said voltage drop by synchronously demodulating said test voltage drop according to said modulation waveform;
   (d) measuring said test voltage drop with a voltmeter;
   (e) turning off said modulated current source;
   (f) measuring said voltage drop across said segment with said voltmeter; and
   (g) determining said current according to said test voltage drop, said voltage drop, and said test current.

2. A method for measuring current in a conductor according to claim 1 further comprising calculating a resistance of said segment according to said test voltage drop and said test current.

3. A method for measuring current in a conductor according to claim 1 further comprising selecting said selected frequency to obtain a noise floor below a predetermined maximum level.

4. A method for measuring current in a conductor according to claim 1 wherein said current comprises alternating current and direct current.

5. A method for measuring current in a conductor according to claim 1, said modulated current source comprising:
   (a) first and second current sources producing currents in opposing polarities; and
   (b) a double pole switch, said double pole switch alternatively coupling said first and second current sources to said segment responsive to said modulation signal.

6. A method for measuring current in a conductor according to claim 1, said synchronous detector comprising:
   (a) a capacitor; and
   (b) a commutating switch for coupling said capacitor in opposing polarities across said segment in synchronization with said modulation signal wherein said test voltage drop is developed across said capacitor.

7. A device for measuring current in a conductor, comprising:
   (a) first and second probes for coupling across a segment of said conductor, each of said probes having a source connection and a sense connection wherein said current generates a voltage drop across said segment;
   (b) a reference waveform generator for generating a modulation signal;
   (c) a modulated current source for generating a test current responsive to said modulation signal and coupled across said segment via said source connections of said first and second probes to generate a test voltage drop;
   (d) a synchronous detector coupled across said segment via said sense connections of said first and second probes to separate said test voltage drop from said voltage drop responsive to said modulation signal;
   (e) a voltmeter for selectably measuring said voltage drop and said test voltage drop to produce digital measurement values; and
   (f) a microprocessor coupled to said voltmeter to receive said digital measurement values wherein said microprocessor calculates said current in said conductor according to said test voltage drop and said voltage drop.

8. A device for measuring current in a conductor according to claim 7 wherein said microprocessor further calculates a resistance of said segment.

9. A device for measuring current in a conductor according to claim 7 wherein said microprocessor is coupled to said reference waveform generator to select a frequency of said modulation waveform to obtain a noise floor below a predetermined maximum level.

10. A device for measuring current in a conductor according to claim 7 wherein said current comprises alternating current and direct current.

11. A device for measuring current in a conductor according to claim 7 wherein said modulated current source comprises first and second current sources producing currents in opposing polarities and a double pole switch, said double pole switch alternatively coupling said first and second current sources to said segment response to said modulation signal.

12. A device for measuring current in a conductor according to claim 7, said synchronous detector comprising:
   (a) a capacitor; and
   (b) a commutating switch for coupling said capacitor in opposing polarities across said segment in synchronization with said modulation signal wherein said test voltage drop is developed across said capacitor.

* * * * *